United States Patent [19]
McCulloch et al.

[11] Patent Number: 5,652,317
[45] Date of Patent: Jul. 29, 1997

[54] ANTIREFLECTIVE COATINGS FOR PHOTORESIST COMPOSITIONS

[75] Inventors: Iain McCulloch, Murray Hill; Ralph R. Dammel; Dana L. Durham, both of Flemington; Ping-Hung Lu, Bridgewater, all of N.J.

[73] Assignee: Hoechst Celanese Corporation, Somerville, N.J.

[21] Appl. No.: 698,742

[22] Filed: Aug. 16, 1996

[51] Int. Cl.⁶ .......................... C08F 226/00; C08F 8/30; G03G 13/06
[52] U.S. Cl. .......................... 526/312; 526/287; 526/288; 430/97; 430/423; 430/435; 525/327.2; 525/376; 524/555
[58] Field of Search .......................... 526/312, 287, 526/288; 430/97, 23; 524/555

[56] References Cited

U.S. PATENT DOCUMENTS 4,631,328  12/1986  Ringsdorf et al. .................. 526/312
5,496,899  3/1996  Fell et al. .................. 526/312

*Primary Examiner*—Tae Yoon
*Attorney, Agent, or Firm*—Sangya Jain

[57] ABSTRACT

The present invention relates to a novel antireflective coating solution and a process for its use in photolithography. The antireflective coating solution comprises a novel polymer and an organic solvent or a mixture of organic solvents, where the novel polymer comprises a unit containing a dye that absorbs from about 180 nm to about 450 nm and a unit containing a crosslinking group.

18 Claims, No Drawings

ANTIREFLECTIVE COATINGS FOR PHOTORESIST COMPOSITIONS

BACKGROUND OF THE INVENTION

The present invention relates to novel antireflective coating compositions and their use in forming a thin layer between a reflective substrate and a photoresist coating. Such compositions are especially useful in the fabrication of semiconductor devices by photolithographic techniques.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has lead to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S=4(R_1R_2)^{1/2}e^{-\alpha D}$$

where $R_1$ is the reflectivity at the resist/air or resist/top coat interface, where $R_2$ is the reflectivity at the resist/substrate interface, where $\alpha$ the resist optical absorption coefficient, and D is the film thickness. Antireflective coating function by absorbing the radiation used for exposing the photoresist, thus reducing $R_2$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss.

In the past dyed photoresists have been utilized to solve these reflectivity problems. However, it is generally known that dyed resists only reduce reflectivity from the substrate but do not totally eliminate it. In addition, dyed resists also cause reduction in the lithographic performance of the photoresist, together with possible sublimation of the dye and incompatibility of the dye in resist films. In cases where further reduction or elimination of the swing ratio is required, an antireflective coating is applied prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high so that the antireflective film is etched without excessive loss of the resist film during the etch process.

Antireflective coatings containing a dye for absorption of the light and an organic polymer to give coating properties are known. However, the possibility of sublimation and diffusion of the dye into the photoresist layer during the heating process make these types of antireflective compositions undesirable.

Polymeric organic antireflective coatings are known in the art as described in EP 583,205 and U.S. Pat. No. 5,525,457 and incorporated herein by reference. However, these antireflective films are cast from organic solvents, such as cyclohexanone and cyclopentanone. The potential hazards of working with organic solvents, have led to the development of the antireflective coating composition of the instant invention, where the solid components of the antireflective coating are both soluble and spin castable from solvents having lesser toxicity hazards. The preferred solvents that are known in the semiconductor industry to have low toxicity among others are propylene gycol monomethyl etheracetate (PGMEA), propylene gycol monomethylether (PGME), and ethyl lactate. The novel dye functionality of the instant invention, together with the specific types of monomers used, make the instant invention significantly different from that claimed in U.S. Pat. No. 5,525,457. Additionally, no intermixing is present between the antireflective coating and the photoresist film. It also has good dry etching properties, which enable a good image transfer from the resist to the substrate and good absorption characteristics to prevent refelective notching and linewidth variations.

SUMMARY OF THE INVENTION

The present invention relates to a novel antireflective coating composition and a process for its use in photolithography. The polymer of the antireflective coating composition comprises at least one unit with a dye functionality and at least one unit with a crosslinking group. The dye functionality is one that strongly absorbs radiation ranging from about 180 nm (nanometer) to about 450 nm. The preferred types of dyed monomeric units that can be used are defined by the following structure:

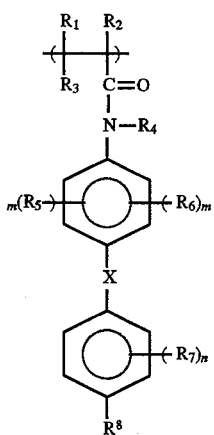

Structure 1 where $R_1$–$R_4$ is H, ($C_1$–$C_4$) alkyl or ($C_1$–$C_4$) alkoxy, $R_5$ is OH, $NH_2$, $OCH_3$ or $OCH_2CH_3$, $R_6$ is H, ($C_1$–$C_4$) alkyl or ($C_1$–$C_4$) alkoxy, $R_7$ is H, ($C_1$–$C_4$) alkyl, alkoxy, nitro, chloro, cyano, dicyanovinyl or $SO_2CF_3$, $R_8$ is nitro, chloro, cyano, dicyanovinyl, $SO_2CF_3$, $SONH_2$, COOY, $SO_3Y$, where Y is H or ($C_1$–$C_4$) alkyl, X is a conjugated moiety e.g. N=N, CZ=CZ, CZ=N, N=CZ, where Z is H, ($C_1$–$C_4$) alkyl or ($C_1$–$C_4$) alkoxy, m=1–3, and n=1–4

The unit containing the crosslinking group is defined by the structure,

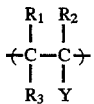

Structure 2 and where the crosslinking groups are typically methylol acrylamides, methacrylamides, ethylene end groups, epoxies, and isocyanates.

The invention further comprises a process of forming an image on a substrate. The substrate is coated with the film of the antireflective coating of the instant invention and heated to remove any residual solvent and to insolubilize the coating. A film from a photoresist solution is then formed on top of the antireflective coating and further heated to substantially remove the photoresist solvent. The photoresist film is imagewise exposed through a mask with ultraviolet radiation ranging from about 180 nm to about 450 nm and processed in an aqueous alkaline developer to give a photoresist pattern. The substrate may be heated prior to and after the development step to give an image of superior quality. The exposed antireflective film can then be dry etched, usually in an oxygen plasma, with the photoresist pattern actting as an etch mask.

The antireflective coating polymer is soluble in organic solvents, in particular in solvents that are of low toxicity and additionally have good coating and solubility properties. The preferred choice of organic solvents that are well known for having low toxicity and are also useful for dissolving the present polymer are PGME, PGMEA or ethyl lactate, although other low toxicity solvents can also be used alone or as mixtures.

DETAILED DESCRIPTION OF THE INVENTION

The antireflective compositions of the present invention comprise a polymer obtained by reacting at least one monomer containing a dye functionality and at least one monomer containing a crosslinking group, and where the polymer thus obtained strongly absorbs ultraviolet light having a wavelength in the range of 180 nm to about 450 nm. The present invention further provides for a process of coating and baking the antireflective coating on a substrate and applying and imaging a photoresist film on top of the antireflective coating.

The polymer of the instant invention is obtained by reacting at least one vinyl monomer containing a dye functionality and at least one vinyl monomer containing a crosslinking group. The dye groups are ones that strongly absorb radiation ranging from about 180 nm to about 450 nm. The preferred types of dyed monomeric units that can be used are defined by the following structure:

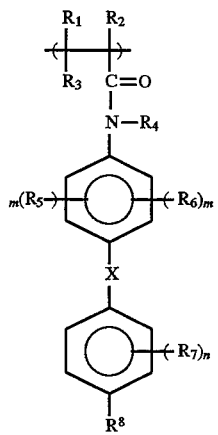

Structure 1 where $R_1$–$R_4$ is H, ($C_1$–$C_4$) alkyl or ($C_1$–$C_4$) alkoxy, $R_5$ is OH, $NH_2$, $OCH_3$ or $OCH_2CH_3$, $R_6$ is H, ($C_1$–$C_4$) alkyl or ($C_1$–$C_4$) alkoxy, $R_7$ is H, ($C_1$–$C_4$) alkyl, alkoxy, nitro, chloro, cyano, dicyanovinyl or $SO_2CF_3$, $R_8$ is nitro, chloro, cyano, dicyanovinyl, $SO_2CF_3$, $SONH_2$, COOY, $SO_3Y$, where Y is H or ($C_1$–$C_4$) alkyl, X is a conjugated moiety e.g. N=N, CZ=CZ, CZ=N, N=CZ, where Z is H, ($C_1$–$C_4$) alkyl or ($C_1$–$C_4$) alkoxy, m=1–3, and n=1–4.

The crosslinking groups present in the antireflective polymer are typically methylol acrylamides, methacrylamides, ethylene end groups, epoxies, isocyanates, but methylol acrylamides and epoxy groups are preferred. The presence of crosslinking groups in the antireflective film are essential to the invention, since the film must be made insoluble in both the solvent of the photoresist and in the developer of the resist, where the developer is an aqueous alkaline solution. Heating the antireflective film after the coating process induces crosslinking of the polymer and hence makes the coating insoluble in the aqueous developer. However, the crosslinking functionality must be stable in the solution of the antireflective polymer and crosslink when heated at temperatures greater than about 70° C. The crosslinking monomeric unit is represented by the following structure:

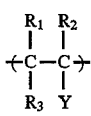

Structure 2 where Y contains the crosslinking functionality and $R_1$ to $R_3$ is H, ($C_1$–$C_4$) alkyl or $C_1$–$C_4$) alkoxy.

Specific examples of crosslinking functionality are shown in the following diagram but are not limited to,

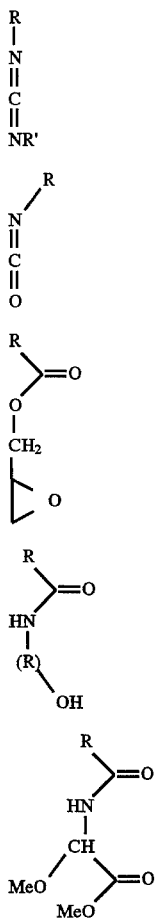

where (1) is a carbodiimide, (2) an isocyanate or blocked equivalent, (3) glycidyl acrylate or methacrylate, (4) an alkylol acrylamide or methacrylamide and, (5) methyl acrylamidoglycolate methyl ether, R is ($C_1$–$C_4$) alkyl, and R' is H or ($C_1$–$C_4$) alkyl.

The antireflective polymer can be synthesized by reacting any number of vinyl monomers containing at least one dye functionality described in Structure 1 and any number of vinyl monomers containing at least one crosslinking functionality as described in Structure 2. Mixtures of different dye monomers from Structure 1 with different substituents and different crosslinking monomers from Structure 2 can be polymerized to give an antireflective coating with the desired lithographic and physical properties. The substituents on each of the monomers can be chosen such that the polymer formed from these monomers is soluble in an organic solvent. Other unsaturated monomers can be added to the polymerization mixture that do not greatly effect the function of the antireflective coating. Examples of such unsaturated monomers are maleic anhydride, vinyl acrylates, vinyl ethers, vinyl acrylamides, vinyl phenolics, vinyl carboxylic acids, vinyl sulphonic acids and N-(3-Hydroxyphenylmethacrylamide). Alternatively, the dye can be functionalized to a copolymer to give the polymer of the current invention.

The process used for polymerization can be any of the ones known in the art for polymerizing vinyl polymers, such as, ionic or free radical polymerization. The polymer structure formed can be composed of alternate, block or random copolymers. The weight average molecular weight of the polymer ranges from about 2,500 to about 1,000,000.

The mole % of the dye containing monomer can range from about 5 to 95, and the mole % of the crosslinking monomer can range from about 1 to about 50 in the final polymer. Additionally, the polymer may contain unreacted precursors and/or monomers from the synthetic steps of the preparation of the polymer.

The antireflective coating composition comprises the polymer of the instant invention and a suitable solvent or mixtures of solvents. Other components may be added to enhance the performance of the coating, e.g. monomeric crosslinking agents, monomeric dyes, lower alcohols, additives to promote crosslinking, surface levelling agents, adhesion promoters, antifoaming agents etc. Examples of crosslinking agents include, but are not limited to, melamines, hydroxy alkyl amides, epoxy and epoxy amine resins, blocked isocyanates, and divinyl monomers. Monomeric dyes may also be added to the antireflective coating, examples of which are sudan orange, 2,4-dinitronaphthol, curcumin, coumarins and others.

The absorption of the antireflective coating can be optimized for a certain wavelength or ranges of wavelengths by the suitable choice of substituents on the dye functionality. Using substituents that are electron-withdrawing or electron donating generally shifts the absorption wavelength to longer or shorter wavelengths respectively. In addition, the solubility of the antireflective polymer in a particularily preferred solvent can be adjusted by the appropriate choice of substituents on the monomer.

The polymer of the antireflective coating composition is present in the range of about 1% to about 30% by total weight of solution. The exact weight used is dependent on the molecular weight of the polymer and the film thickness of the coating desired. Typical solvents, used as mixtures or alone, that can be used are propylene glycol monomethyl ether(PGME), propylene glycol monomethyl etheracetate (PGMEA), ethyl lactate, cyclopentanone, cyclohexanone, and gamma butyrolactone, but PGME, PGMEA and ethyl lactate or mixtures thereof are preferred. Solvents with a lower degree of toxicity, and good coating and solubility properties are generally preferred.

Since the antireflective film is coated on top of the substrate and is further subject to dry etching it is envisioned that the film is of sufficiently low metal ion level and purity that the properties of the semiconductor device are not adversely effected. Treatments such as passing a solution of the polymer through an ion exchange column, filteration, and an extraction process can be used to reduce the concentration of metal ions and to reduce particles.

The antireflective coating composition is coated on the substrate using techniques well known to those skilled in the art, such as dipping, spincoating or spraying. The film thickness of the antireflective coating ranges from about 0.1 micron to about 1 micron. The coating is further heated on a hot plate or convection oven to remove any residual solvent and to induce the appropriate degree of crosslinking in order to insolubilize the film.

Photoresists coated over the antireflective film can be any of the types used in the semiconductor industry provided the sensitivity of the photoactive compound in the photoresist matches that of the antireflective coating.

There are two types of photoresist compositions, negative-working and positive-working. working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 350 nm to 440 nm.

Photoresists sensitive to short wavelengths, between about 180 nm and about 300 nm can also be used. These resists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. Nos. 4,491,628, 5,069,997 and 5,350,660.

The process of the instant invention further comprises coating a substrate with the novel antireflective coating and heating on a hotplate or convection oven at a sufficiently high temperature for sufficient length of time to remove the coating solvent and crosslink the polymer to a sufficient extent so as not to be soluble in the coating solution of the photoresist or in the aqueous alkaline developer. The preferred range of temperature is from about 70° C. to about 250° C. If the temperature is below 70° C. then insufficient loss of solvent or insufficient degree of crosslinking takes place and at temperatures above 250° C. the polymer may become chemically unstable. A film of photoresist is then coated on top of the antireflective coating and baked to substantially remove the photoresist solvent. The photoresist is imagewise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

Preparation of N-(3-Hydroxyphenylmethacrylamide)

100.2 g (0.9 mol) of m-aminophenol were discharged in 200 ml of acetone contained in a 1000 ml three-neck round-bottom flask. A thermometer was placed in the solution and the flask was immersed in a bath of crushed ice, and cooled until the temperature of the solution fell below 5° C. to form a suspension. Dropwise a solution of 144.2 ml (0.91 mol) methacrylic anhydride was added to 300 ml of acetone. After the addition, the mixture was stirred for 2 hours and warmed to room temperature. The reaction mixture was poured into 2000 ml of ice-water to precipitate the product. The solution was filtered and washed with water. The precipitate was dried in air to give 129 g product. The yield of the product was 81%.

EXAMPLE 2

15.95 g (0.09 mol) of N-(3-hydroxyphenylmethacrylamide) from Example 1 were dissolved in γ butyrolactone (150 ml). The mixture was warmed to 65° C. while being stirred and degassed by vigorously bubbling argon, via an inlet needle in sealed rubber septum, through the solution for 1 hour. 3.92 ml (0.02 mol) of N-(hydroxymethyl) acrylamide and 11.89 g (0.09 mol) 2-[2-(ethenyloxy)ethoxy]-ethanol were injected. The solution was degassed for 0.5 hour. An aliquot from a solution of AIBN (azo-bis-isobutyronitrile) (0.335 g, 2 mmol, 1 mol % total monomer) was injected into γ butyrolactone (2.0 ml) and degassed for 0.5 hour. In total, 2 aliquots were added at intervals of 5 hours. Both inlet and outlet needles were removed and the solution allowed to stir in the sealed vessel at 65° C. for 22 hours.

EXAMPLE 3

3.47 g (22.5 mmol) of methyl 4-aminobenzoate were dissolved in 4.57 ml (56.25 mmol) of concentrated hydrochloric acid and 45 ml of water contained in a 100 ml round-bottom flask. The flask was immersed in a bath of crushed ice, cooled until the temperature of the solution fell below 2° C. Diazotization was done by the addition of 2.8 ml (22.6 mmol) tert-butyl nitrite. The diazonium solution was stirred in ice-water for about 1 hour. A yellow solution was formed.

EXAMPLE 4

A 22.25 ml portion of the polymer solution from Example 2 was placed in a 500 ml round bottomed flask. To this was added 100 ml of DMF (dimethylformamide) and the solution cooled below 5° C. in an ice-water bath. 3.28 ml (39.375 mmol) of pyridine were added while stirring. The cold diazonium salt solution from Example 3, between 10° C. and 15° C., was added, and the solution changed to a red color. The mixture was allowed to stir for about 3 hours and warmed to room temperature. This solution was poured into a solution of 3000 ml of ice-water in 10 ml of concentrated hydrochloric acid. The solution was filtered and the polymer washed with water (2000 ml) and dried in air.

EXAMPLE 5

11.96 g (0.0675 mol) of N-(3-hydroxyphenylmethacrylamide) from Example 1 were dissolved in γ butyrolactone (75 ml) and DMF (75 ml). The mixture was heated to 65° C. while stirring and degassed by vigorously bubbling argon, via an inlet needle in sealed rubber septum, through the solution for 1 hour. 4.41 ml (0.0225 mol) of N-(hydroxymethyl)acrylamide and 6.48 ml (0.06 mol) methyl methacrylate were injected. The solution was degassed for 0.5 hour. An aliquot from a solution of AIBN (0.251 g, 1.5 mmol, 1 mol % total monomer) was injected into γ butyrolactone (2 ml) and degassed for 0.5 hour. In total, 2 aliquots were added at intervals of 4 hours. Both inlet and outlet needles were removed and the solution was allowed to stir in the sealed vessel at 65° C. for 19 hours.

EXAMPLE 6

4.68 g (0.03375 mol) of 4-aminobenzoic acid were dissolved in 6.68 ml (0.084375 mol) of concentrated hydrochloric acid and 70 ml of water, contained in a 250 ml three-neck round-bottom flask. A thermometer was placed in the solution and the flask immersed in a bath of crushed ice, cooled until the temperature of the solution falls below 2° C. The solution was a white suspension. The solution was diazotized by the addition of 4.19 ml (0.0338 mol) tert-butyl nitrite. The diazonium solution was stirred in ice-water for about 1 hour. The suspension changed to a yellow solution.

EXAMPLE 7

80 ml (0.075 mol) of the polymer solution from Example 5 were placed in a 500 ml round bottomed flask. To this was added 320 ml of DMF and a solution of 42.52 ml (0.1185 mol) tetramethylammonium hydroxide (25% in water) while stirring. The solution was cooled in an ice-water bath to 10° C. The cold diazonium salt solution from Example 6 was added and the solution changed to orange color. The mixture was stirred for about 3 hours and warmed to room temperature. The resultant solution was poured into a solution of 3000 ml of ice-water in 11 ml of concentrated hydrochloric acid. The solid polymer was filtered and then washed with water (1000 ml) and air dried.

EXAMPLE 8

The polymer from Example 7 was dissolved in PGME to give a 7 weight % solution. The polymer solution was spin coated on two 4" silicon wafers, and baked on a hot plate at 150° C. for 60 seconds to give a thickness of 0.2 micrometer. Each of the coated wafers were immersed in PGMEA, and 85/15 mixture of ethyl lactate and butyl acetate, both resist solvents, for 30 seconds. The film thickness of the polymer coatings was measured before and after the immersion. The results are given in Table 1.

TABLE 1

| Solvent | $T_1$ | $T_2$ | $T_3$ |
|---|---|---|---|
| PGMEA | 2101Å | 2098Å | 2092Å |
| 85/15 EL/n-BA | 2102Å | 2112Å | 2089Å |

$T_1$: polymer film thickness after spin coating and baking at 150° C. for 60 seconds.

$T_2$: polymer film thickness after immersion in the photoresist solvent for 30 seconds.

$T_3$: polymer film thickness after softbaking at 90° C. for 90 seconds.

The results from Table 1 show that no significant change in film thickness was observed, and hence no dissolution of the baked polymer in typical resist solvents took place.

EXAMPLE 9

The polymer from Example 7 was dissolved in PGME to give a 7 weight % solution. The polymer solution was spin coated on a 4" silicon wafer, and baked on a hot plate at 200° C. for 60 seconds to give a thickness of 0.2 micrometer. The coated wafer was immersed in AZ® 300 MIF developer (available from Hoechst Celanese Corp. 70 Meister Av. Sommerville, N.J. 08876). The film thickness of the polymer was measured before and after immersion. No change in film thickness was observed, showing that the baked polymer film was not attacked by the developer.

EXAMPLE 10 (Comparative)

Several 4" wafers were coated with AZ® 7805 (available from Hoechst Celanese Corporation, 70 Meister Ave., Somerville, N.J. 08876) and baked using a soft bake temperature of 90° C. for 90 seconds to give thickness from 0.5 µm (micrometers) to 0.9 µm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm$^2$. The exposed wafers were baked at 110° C. for 60 seconds and puddle developed with AZ® 300 MIF developer (available from Hoechst Celanese Corporation, 70 Meister Ave., Somerville, N.J. 08876) for 35 seconds. The minimum dose required to clear the film was plotted as a function of the corresponding resist thickness, and a sinusoidal curve was obtained, called the swing curve. The % Swing ratio was calculated by the following equation:

$$\% \text{ Swing Ratio} = (E_{max} - E_{min})/((E_{max} + E_{min})/2) \times 100$$

where Emax and Emin correspond to the dose-to-clear the resist film thickness at the maximum and minimum energy on a swing curve. The smaller the value of % Swing Ratio the lower is the impact of reflectivity and the better is linewidth control over reflective substrate or topography.

The % Swing Ratio for AZ® 7805 was 21.02%.

EXAMPLE 11

The polymer from Example 7 was dissolved in PGME to give a 7 weight % solution. The polymer solution was spin coated on several 4" silicon wafer, and baked on a hot plate at 200° C. for 60 seconds to give a thickness of 0.2 micron. The wafers were then coated with with AZ® 7805 (available from Hoechst Celanese Corporation, 70 Meister Ave., Somerville, N.J. 08876) and baked using a temperature of 90° C. for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm². The exposed wafers were baked at 110° C. for 60 seconds and puddle developed with AZ® 300 MIF developer for 35 seconds. The minimum dose required to clear the film was plotted as a function of the corresponding resist thickness, and a sinusoidal curve was obtained, called the swing curve. The % Swing Ratio was calculated as in Example 10.

The % Swing Ratio for AZ® 7805 with antireflective polymer coating of this Example with was 5.85%, showing a significant reduction in the % Swing Ratio from the resist without the antireflective coating.

EXAMPLE 12

The polymer from Example 7 was dissolved in PGME to give a 7 weight % solution together with 15 weight % by weight of polymer of Cymel 1158 (available from CYTEC Industries, 1937 West Main Street, P.O. Box 60, Stamford, Conn. 06904). The polymer solution was spin coated on several 4" silicon wafer, and baked on a hot plate at 200° C. for 60 seconds to give a thickness of 0.2 micron. The wafers were then coated with AZ® 7805 (available from Hoechst Celanese Corporation, 70 Meister Ave., Somerville, N.J. 08876) and baked using a temperature of 90° C. for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm². The exposed wafers were baked at 110° C. for 60 seconds and puddle developed with AZ® 300 MIF developer for 35 seconds. The minimum dose required to clear the film was plotted as a function of the corresponding resist thickness, and a sinusoidal curve was obtained, called the swing curve. The % Swing Ratio was calculated as in Example 10. The % Swing Ratio for AZ® 7805 with antireflective polymer coating of this Example was 5.26%, showing a significant reduction in the % Swing Ratio from the resist without the antireflective coating.

EXAMPLE 12

The polymer from Example 7 was dissolved in PGMEA to give a 7 weight % solution together with 15 weight % by weight of polymer of Cymel 303 (available from CYTEC Industries, 1937 West Main Street, P.O. Box 60, Stamford, Conn. 06904). The polymer solution was spin coated on several 4" silicon wafer, and baked on a hot plate at 200° C. for 60 seconds to give a thickness of 0.2 micron. The wafers were then coated with with AZ® 7805 (available from Hoechst Celanese Corporation, 70 Meister Ave., Somerville, N.J. 08876) and baked using a temperature of 90° C. for 90 seconds to give thickness from 0.5 μm (micrometers) to 0.9 μm (micrometers). These wafers were imagewise exposed with a NIKON® 0.54 NA i-line stepper using a clear quartz as the reticle and a program that directed the stepper to print a 11×11 exposure matrix with dose increments of 2 mJ/cm². The exposed wafers were baked at 110° C. for 60 seconds and puddle developed with AZ® 300 MIF developer for 35 seconds. The minimum dose required to clear the film was plotted as a function of the corresponding resist thickness, and a sinusoidal curve was obtained, called the swing curve. The % Swing Ratio was calculated as in Example 10.

The % Swing Ratio for AZ® 7805 with antireflective polymer coating of this Example was 4.25%, showing a significant reduction in the % Swing Ratio from the resist without the antireflective coating.

We claim:

1. An antireflecting coating composition for use in photolithography, comprising a) a polymer comprising at least one dye unit having the structure,

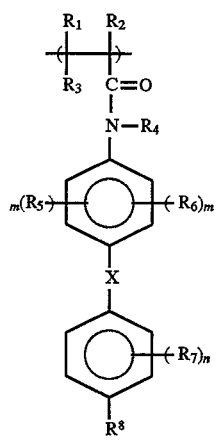

where $R_1$–$R_4$ is H, ($C_1$–$C_4$) alkyl or ($C_1$–$C_4$) alkoxy,
$R_5$ is OH, $NH_2$, $OCH_3$ or $OCH_2CH_3$,
$R_6$ is H, ($C_1$–$C_4$) alkyl or ($C_1$–$C_4$) alkoxy,
$R_7$ is H, ($C_1$–$C_4$) alkyl, ($C_1$–$C_4$) alkoxy, nitro, chloro, cyano, dicyanovinyl or $SO_2CF_3$,
$R_8$ is nitro, chloro, cyano, dicyanovinyl, $SO_2CF_3$, $SONH_2$, COOY, $SO_3Y$, where Y is H,
X is a conjugated moiety N=N, CZ=CZ, CZ=N, N=CZ, where Z is H, ($C_1$–$C_4$) alkyl or ($C_1$–$C_4$) alkoxy,
m=1–3, and n=1–4; and, at least one unit capable of crosslinking the polymer having the structure

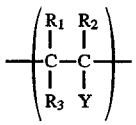

where Y contains a crosslinking functionality and $R_1$ to $R_3$ are H, ($C_1$–$C_4$) alkyl or ($C_1$–$C_4$) alkoxy and, b) a suitable organic solvent.

2. The antireflective composition according to claim 1, wherein the solvent comprises a mixture of organic solvents.

3. The antireflective composition according to claim 1, wherein the solvent is selected from a group consisting of propylene glycol monomethyl ether, propylene glycol monomethyl etheracetate, ethyl lactate, cyclopentanone, cyclohexanone, and gamma butyrolactone.

4. The antireflective composition according to claim 1, wherein the crosslinking group is selected from a group consisting of carbodiimide, isocyanate, blocked isocyanate, glycidyl methacrylate, alkylol acrylamide, alkylol methacrylamide and methyl acrylamidoglycolate.

5. The antireflective composition according to claim 1, wherein X in the dye unit is an azo group.

6. The antireflective composition of claim 1, wherein the dye unit ranges from about 5 to about 95 mole percent and the crosslinking unit ranges from about 1 to about 50 mole percent of the polymer.

7. The antireflective composition according to claim 1, wherein the polymer further comprises one or more vinyl monomers that are nonabsorbing and noncrosslinking.

8. The antireflective composition according to claim 7, wherein the vinyl monomer is selected from a group consisting of maleic anhydride, vinyl acrylates, vinyl phenolics, vinyl ethers, vinyl acrylamides, vinyl carboxylic acids, vinyl sulphonic acids and N-(3-Hydroxyphenylmethacrylamide).

9. The antireflective composition according to claim 1, further comprising a dye.

10. The antireflective composition according to claim 1, further comprising a crosslinking agent.

11. The antireflective composition according to claim 1, wherein the polymer has a weight average molecular weight in the range of about 2,500 to about 1,000,000.

12. The antireflective composition according to claim 1, wherein the metal ion level is less than 50 ppb each metal ion.

13. The process of forming an image on a substrate comprising the steps of:
   a) coating the substrate with the antireflective coating composition of claim 1,
   b) heating the antireflective coating,
   c) a coating from a photoresist solution on the substrate,
   d) heating the photoresist coating to substantially remove solvent from the coating,
   e) imagewise exposing the photoresist coating,
   f) developing an image using an aqueous alkaline developer,
   g) optionally, heating the substrate prior to and after development,
   h) dry etching the antireflective coating.

14. The process of claim 13, wherein the photoresist solution comprises a novolak resin, a photosensitive compound and a solvent.

15. The process of claim 13, wherein the photoresist solution comprises a substituted polyhydroxystyrene, a photoactive compound and a solvent.

16. The process of claim 13, wherein the photoresist solution comprises polyhydroxystyrene, a photoactive compound, a dissolution inhibitor and a solvent.

17. The process of claim 13, wherein the heating temperature for the antireflective coating ranges from about 70° C. to about 250° C.

18. The process of claim 13, wherein the developer is an aqueous solution of metal ion free alkaline hydroxide.

* * * * *